(12) United States Patent
Wolf

(10) Patent No.: US 6,181,175 B1
(45) Date of Patent: Jan. 30, 2001

(54) CLOCK GENERATOR AND SYNCHRONIZING METHOD

(75) Inventor: Michael Wolf, Mundelsheim (DE)

(73) Assignee: Alcatel, Paris (FR)

( * ) Notice: Under 35 U.S.C. 154(b), the term of this patent shall be extended for 0 days.

(21) Appl. No.: 09/340,673

(22) Filed: Jun. 29, 1999

(30) Foreign Application Priority Data

Jul. 7, 1998 (DE) .............................. 198 30 260

(51) Int. Cl.⁷ ..................................................... H03L 7/00
(52) U.S. Cl. .................. 327/163; 327/3; 327/5; 327/7; 327/156
(58) Field of Search ................... 327/156, 163, 327/298, 3, 5, 7

(56) References Cited

U.S. PATENT DOCUMENTS

| | | | |
|---|---|---|---|
| 3,872,455 | * 3/1975 | Fuller et al. | 340/347 |
| 4,567,448 | 1/1986 | Ikeda | 331/25 |
| 4,568,881 | 2/1986 | Kostrov | 328/109 |
| 4,855,683 | 8/1989 | Troudet et al. | 328/155 |
| 5,552,726 | 9/1996 | Wichman et al. | 327/149 |

FOREIGN PATENT DOCUMENTS

| | | |
|---|---|---|
| 40 24 239 C1 | 10/1991 | (DE) . |
| 42 42 807 C1 | 3/1994 | (DE) . |
| 195 23 186 A1 | 1/1997 | (DE) . |
| 0 043 407 A2 | 1/1982 | (EP) . |
| 0 567 990 A1 | 11/1993 | (EP) . |
| 0 604 188 A2 | 6/1994 | (EP) . |
| 0 715 412 A1 | 6/1996 | (EP) . |

* cited by examiner

Primary Examiner—Kenneth B. Wells
Assistant Examiner—Cassandra Cox
(74) Attorney, Agent, or Firm—Sughrue, Mion, Zinn, Macpeak & Seas, PLLC

(57) ABSTRACT

Network elements of a synchronous digital communications system have a clock generator for generating a clock signal locked to an input signal. Such a clock generator comprises a tunable oscillator (OSC) and a phase comparator (PK) for comparing the phase of the input signal (IN) with the phase of the clock signal (CLK) and for generating a correction signal which serves to tune the oscillator (OSC). To avoid phase transients due to interruptions and disturbances in the input signal (IN), means (WD) are provided for determining an expectancy window, for deciding whether the correction signal lies within the expectancy window, and for tuning the oscillator with the correction signal if the correction signal lies within the expectancy window.

12 Claims, 2 Drawing Sheets

CLOCK GENERATOR AND SYNCHRONIZING METHOD

BACKGROUND OF THE INVENTION

This invention relates to a clock generator having a tunable oscillator and a phase comparator, and to a method of generating a clock signal synchronized with an input signal by comparing the phase of a tunable oscillator with the phase of the signal input.

Network elements of a synchronous digital communications network such as an SDH (synchronous digital hierarchy) or SONET (synchronous optical network) system must be synchronized with a central reference clock which is derived from received message signals. To derive the reference clock signal and perform clock filtering, clock generators are used in each network element of the network. Such a clock generator contains a digital phase-locked loop (PLL), which is locked to an input signal and provides an output signal having the same frequency as the input signal on a long-term basis. A phase-locked loop comprises a tunable oscillator and a phase comparator which compares the input signal with the output signal of the oscillator and provides a resultant output value which is used as a correction signal for tuning the oscillator.

Each interruption of the input signal causes a phase transient in the output signal depending on the control time constant of the PLL. As a result, the average frequency of the output signal is corrupted, particularly in case of frequent short-time interruptions of the input signal. This effect is particularly pronounced in PLLs with edge-triggered phase comparators.

SUMMARY OF THE INVENTION

It is an object of the invention to provide a clock generator which is insensitive to interruptions of the input signal. Another object of the invention is to provide a method of synchronizing a clock generator whereby no undesired phase transients are caused in the output signal by interruptions or disturbances of the input signal.

These objects and additional advantages features are attained by the present invention.

One advantage of the invention is that the effect of disturbances and interruptions of the input signal on the output signal is minimized. A further, particular advantage is that even frequent interruptions for fractions of a clock cycle do not result in phase transients in the output signal. This makes it possible to use even a disturbed signal as an input signal for synchronization.

BRIEF DESCRIPTION OF THE DRAWINGS

The invention will become more apparent from the following description of an embodiment taken in conjunction with the accompanying drawings, in which.

DETAILED DESCRIPTION OF THE INVENTION

A basic idea of the invention is to detect short-time interruptions and treat them in a suitable manner, i.e., not to tune the oscillator during such interruptions. This is accomplished by defining an expectancy window and adjusting the frequency of the oscillator only if the value measured by a phase comparator lies within this expectancy window. Otherwise an interruption or disturbance has occurred and the oscillator will not be tuned but will continue to run free. If after an interruption a stable input signal is present again, a new expectancy window can subsequently be determined by averaging over several clock cycles of the input signal, and the center of this new expectancy window is fixed as a new reference value for the phase-locked loop.

Figure 1:
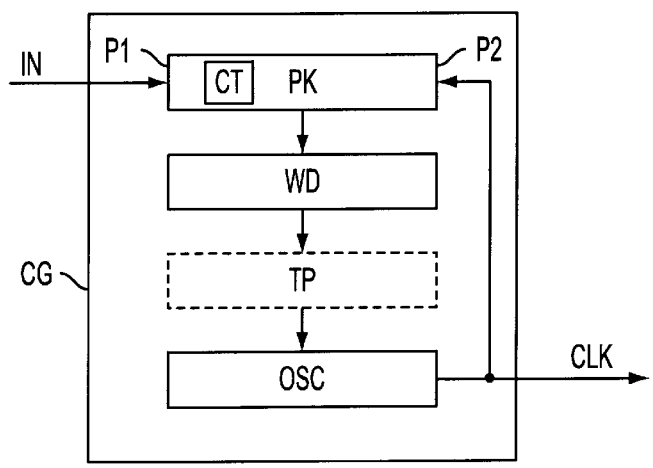
FIG. 1 is a block diagram of the clock generator according to the invention.

The clock generator according to the invention shown in FIG. 1 comprises a phase comparator PK and a device WD which defines an expectancy window, determines whether the output value of the phase comparator PK lies within the expectancy window, and, if so, passes the output value as a correction signal to a subsequent tunable oscillator OSC. The phase comparator PK has two inputs P1 and P2. At one of the inputs, P1, an input signal IN is applied, for example a 2-MHz clock signal. The other input P2 is connected to the output of the oscillator. The output value of the phase comparator PK is a difference between the phase values of the two input signals and serves to tune the oscillator. The circuit thus represents a phase-locked loop (PLL). At the output CLK of the clock generator, a clock signal locked to the input signal IN is available.

The expectancy window is the interval in which the output value of the phase comparator is expected. The output value may vary slightly due to permissible jitter (=phase variations) on the input signal. If the output value differs from an expected value by greater amounts and, thus, does not fall within the expectancy window, the input signal is disturbed and the oscillator will not be tuned so as not to transmit the disturbance to the output signal of the clock generator. In this manner, phase transients in the clock signal CLK at the output are avoided and the clock signal has a higher frequency stability.

Between device WD and tunable oscillator OSC, a low-pass filter TP (shown dotted) may be inserted. The phase comparator can be a digital, edge-triggered phase comparator built with two counters CT, a radio-frequency crystal oscillator as an auxiliary oscillator, and an adder. Each of the counters counts the pulses from the crystal oscillator between every two leading pulse edges of the input signal and the clock signal. The adder forms the difference of the two counts. This value can be used as a correction signal for a digitally controlled oscillator, but it also can be converted by a D/A converter into a voltage signal which, in turn, can serve as a correction signal for a voltage-controlled oscillator. Accordingly, low-pass filter TP and device WD can be either digital or analog components.

In this embodiment it is particularly advantageous if the adder additionally adds an offset value. This offset value then represents the negative reference value of the phase-locked loop ("phase build-out"). Through the reference value, an initial, accidental phase difference between input signal and clock signal is preserved as a constant offset. Thus, phase jumps during resynchronization of the clock generator are avoided. The offset value can be determined by averaging the difference value over a number (e.g., 1000) of clock cycles during resynchronization.

The clock generator is used in a network element of a synchronous digital communications network. The input signal can be a clock signal recovered from a received message signal. The input signal serves as an external reference.

Figure 2:
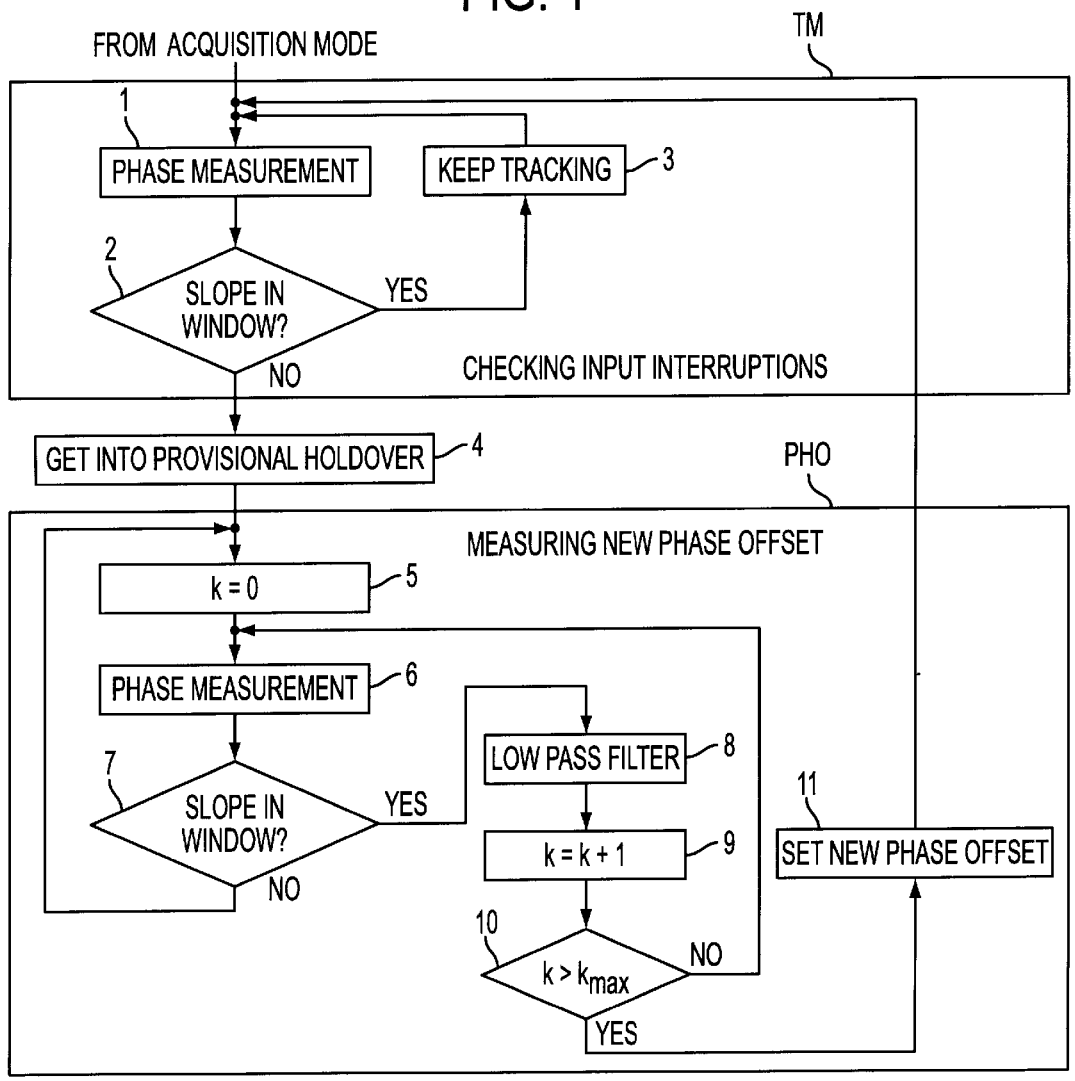
FIG. 2 is a flowchart showing the steps of the method according to the invention during operation.
Figure 3:
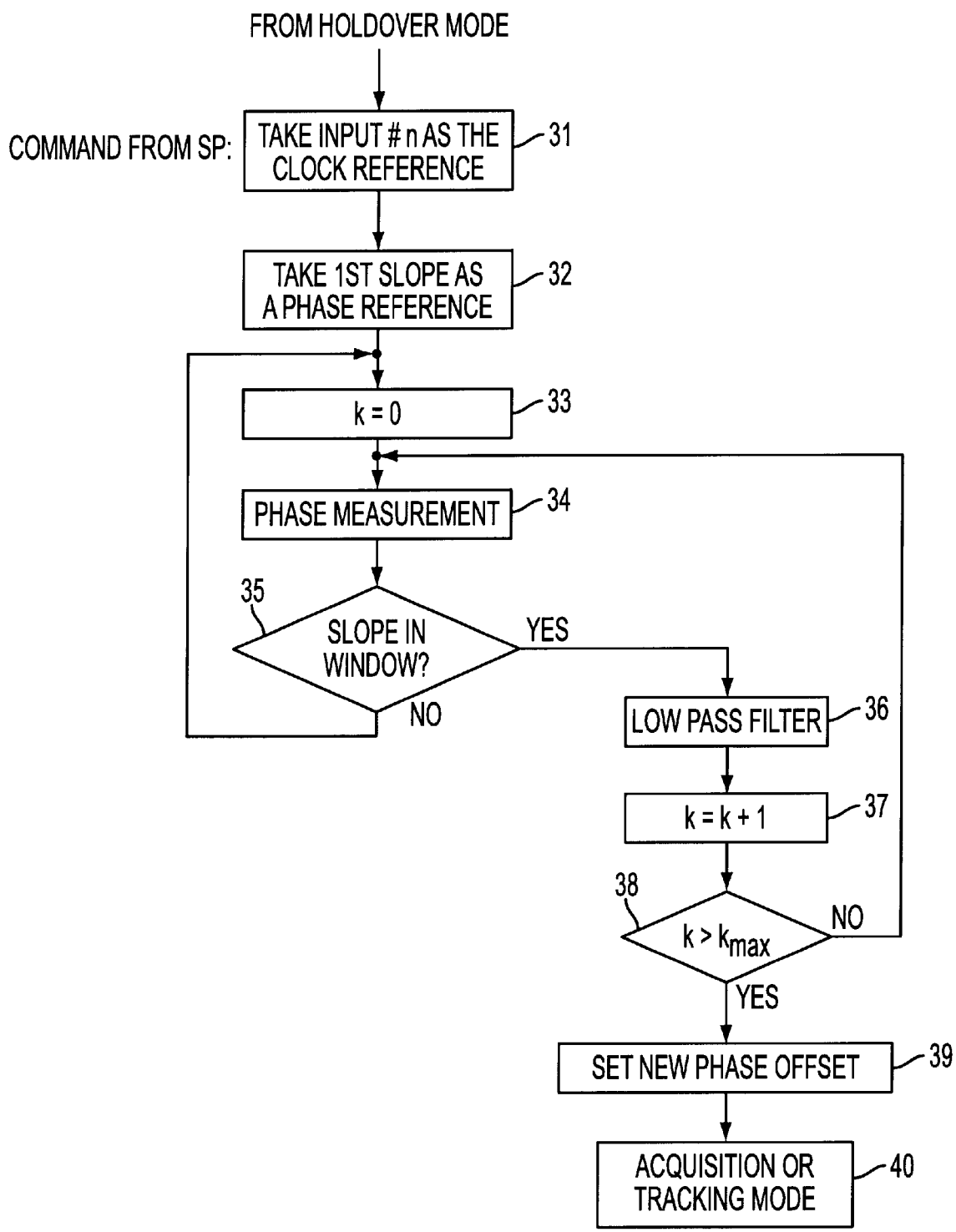
FIG. 3 is a flowchart showing the steps of the method according to the invention during resynchronization with a new reference clock source.

FIGS. 2 and 3 are flowcharts showing the steps of the synchronizing method according to the invention. FIG. 2 shows the method during operation, while FIG. 3 illustrates the start-up or the resynchronization with a new reference clock source.

In operation, the steps shown in FIG. 2 are performed:

Step 1: By a phase measurement, the phase difference between the input signal and the clock signal at the output of the oscillator is measured.

Step 2: A check is made to determine whether the measured phase difference lies within the expectancy window. The expectancy window defines a range about a reference value of the phase-locked loop.

Step 3: If the measured phase difference lies within the expectancy window, the oscillator will be tuned with a correction value derived from the phase difference.

Steps 1 to 3 represent the normal operating mode TM, the tracking mode. The normal mode is characterized by the fact that the oscillator is tuned on a regular basis and that the input signal is checked for interruptions.

If the measured phase difference does not lie within the expectancy window, a fourth step, the provisional holdover mode PHO, follows, in which the oscillator is not tuned but runs free. If no new synchronization takes place within a predetermined period of time, the provisional holdover mode PHO will be followed by the normal holdover mode and a corresponding error message will be generated. In the provisional holdover mode, attempts are made to determine a new reference value and define a new expectancy window.

Step 4: Provisional holdover mode.

Step 5: A count variable k is initialized by being set to zero.

Step 6: A new phase measurement is performed as in step 1.

Step 7: A check is made to see whether the phase difference of the new phase measurement lies within the expectancy window. If that is not the case, a branch is made back to step 5.

Step 8: If the phase difference of the new phase measurement lies within the expectancy window, the phase difference measured in step 6 will be low-pass-filtered.

Step 9: The count variable k is incremented by one.

Step 10: A check is made to see whether the count variable has exceeded a predetermined threshold $k_{max}$. If that is not the case, a branch is made back to step 6. In the embodiment, the threshold value $k_{max}$ is 1000.

Step 11: If the count variable has exceeded the predetermined threshold $k_{max}$, an average of the last $k_{max}$ phase difference values will befixed as a new reference value for the phase-locked loop. An interval of predetermined width centered at the new reference value is defined as a new expectancy window.

After that, a branch is made back to the normal mode, i.e., to step 1.

After a prolonged interruption (over several clock cycles), changeover is effected to the normal holdover mode, in which the oscillator is not tuned. In that case and during start-up, initial synchronization with a reference clock source must be achieved. According to the flowchart shown in FIG. 3, this is accomplished by the following steps:

Step 31: An input signal is selected. This is only necessary if input signals from two or more possible reference clock sources are available. As a rule, two or more possible reference clock sources are available in network elements in order that switchover to a standby synchronization facility can be effected in the event of a failure of a reference clock source.

Step 32: A first phase measurement is performed as in step 1. The difference is used as the first reference value for the phase-locked loop. Based on this reference value, the expectancy window is defined.

Step 33: A count variable k is initialized by being set to zero.

Step 34: A new phase measurement is performed as in step 1.

Step 35: A check is made to see whether the phase difference of the new phase measurement lies within the expectancy window. If that is not the case, a branch is made back to step 33.

Step 36: If the phase difference of the new phase measurement lies within the expectancy window, the phase difference measured in step 34 will be low-pass-filtered.

Step 37: The count variable k is incremented by one.

Step 38: A check is made to see whether the count variable has exceeded a predetermined threshold $k_{max}$. If that is not the case, a branch is made back to step 34.

Step 39: If the count variable has exceeded a predetermined threshold $k_{max}$, an average of the last $k_{max}$ phase difference values is fixed as a new reference value for the phase-locked loop. An interval of predetermined width centered at the new reference value is defined as a new expectancy window.

This is followed by step 40, the normal mode illustrated in FIG. 2.

What is claimed is:

1. A clock generator (CG) for generating a clock signal (CLK) synchronized with an input signal (IN), comprising:
   a tunable oscillator (OSC);
   a phase comparator (PK) for comparing the phase of the input signal (IN) with the phase of the clock signal (CLK) and for generating a correction signal based on the comparing; and
   means (WD) for defining an expectancy window, for deciding whether the correction signal lies within the expectancy window, and for tuning the oscillator (OSC) with the correction signal if the correction signal lies within the expectancy window.

2. A clock generator (CG) as claimed in claim 1, further comprising means for determining a reference value that corresponds to a constant phase difference between the input signal and the clock signal.

3. A clock generator (CG) as claimed in claim 2 wherein the reference value is determined by averaging a number of phase measurements.

4. A clock generator as claimed in claim 1 wherein the phase comparator comprises a digital phase comparator comprising a counter for the generated clock signal and a counter for the input signal, and wherein a difference of the two counts output by the two respective counters serves as a basis for generating the correction signal.

5. A clock generator as claimed in claim 1 wherein the expectancy window corresponds to a maximum permissible jitter of the input signal.

6. A method of generating a clock signal (CLK) synchronized with an input signal (IN), comprising comparing the phase of an output signal of a tunable oscillator (OSC) with the phase of the input signal (IN) and using a phase comparison difference to generate a correction signal for tuning the oscillator (OSC), comprising the steps of:
   defining an expectancy window;
   deciding whether the correction signal lies within the expectancy window; and
   tuning the oscillator (OSC) with the correction signal if the correction signal lies within the expectancy window.

7. A method as claimed in claim 6, further comprising the steps of:

determining an average over several clock cycles if the correction signal lies outside the expectancy window;

determining a new expectancy window based on the average; and using the average as a new reference value for phase offsetting during the tuning of the oscillator (OSC).

8. A clock generator (CG) for generating a clock signal (CLK) synchronized with an input signal (IN), comprising:

a tunable oscillator (OSC); and a phase comparator (PK) operative to compare the phase of the input signal (IN) with the phase of the clock signal (CLK) and to generate a correction signal which serves to tune the oscillator (OSC), said phase comparator comprising:

an expectancy circuit (WD) operative to define an expectancy window, determine whether the correction signal lies within the expectancy window, and tune the oscillator with the correction signal if the correction signal lies within the expectancy window.

9. A clock generator (CG) as claimed in claim 8, further comprising an offset determining circuit that determines a reference value corresponding to a constant phase difference between the input signal and the clock signal.

10. A clock generator (CG) as claimed in claim 9 wherein the reference value is determined by averaging a number of phase measurements.

11. A clock generator as claimed in claim 8, wherein the phase comparator comprises a digital phase comparator comprising a counter for the generated clock signal and a counter for the input signal, and wherein a difference of the two counts output by the two respective counters serves as a basis for generating the correction signal.

12. A clock generator as claimed in claim 8 wherein the expectancy window corresponds to a maximum permissible jitter of the input signal.

* * * * *